United States Patent
Takahashi et al.

(10) Patent No.: US 10,677,824 B2
(45) Date of Patent: Jun. 9, 2020

(54) DISTRIBUTED-GENERATOR POWER-GENERATION-AMOUNT ESTIMATION APPARATUS AND METHOD

(71) Applicant: Hitachi, Ltd., Chiyoda-ku, Tokyo (JP)

(72) Inventors: Hirotaka Takahashi, Tokyo (JP); Masahiro Adachi, Tokyo (JP); Katsuhiro Matsuda, Sendai (JP)

(73) Assignee: Hitachi, Ltd., Tokyo (JP)

(*) Notice: Subject to any disclaimer, the term of this patent is extended or adjusted under 35 U.S.C. 154(b) by 334 days.

(21) Appl. No.: 15/757,498

(22) PCT Filed: Jun. 16, 2016

(86) PCT No.: PCT/JP2016/067945
§ 371 (c)(1),
(2) Date: Mar. 5, 2018

(87) PCT Pub. No.: WO2017/043143
PCT Pub. Date: Mar. 16, 2017

(65) Prior Publication Data
US 2018/0252753 A1    Sep. 6, 2018

(30) Foreign Application Priority Data

Sep. 10, 2015 (JP) ................................ 2015-178148

(51) Int. Cl.
*G01R 21/133* (2006.01)
*H02J 3/38* (2006.01)
(Continued)

(52) U.S. Cl.
CPC ............ *G01R 21/1331* (2013.01); *H02J 3/00* (2013.01); *H02J 3/382* (2013.01); *H02J 3/18* (2013.01);
(Continued)

(58) Field of Classification Search
CPC ........ G01R 21/1331; H02J 3/00; H02J 3/382; H02J 3/18; H02J 2203/20; Y02E 40/30; Y02E 40/22; Y02E 60/76
See application file for complete search history.

(56) References Cited

U.S. PATENT DOCUMENTS

| 2010/0094574 A1* | 4/2010 | He ............................ H02J 3/00 702/62 |
| 2018/0152020 A1* | 5/2018 | Kuroda ...................... H02J 3/00 |
| 2019/0148940 A1* | 5/2019 | Itaya ....................... G06Q 50/06 700/291 |

FOREIGN PATENT DOCUMENTS

| JP | 2009-261226 A | 11/2009 |
| JP | 2010-213513 A | 9/2010 |

(Continued)

OTHER PUBLICATIONS

International Search Report (PCT/ISA/210) issued in PCT Application No. PCT/JP2016/067945 dated Aug. 30, 2016 with English translation (five pages).

(Continued)

*Primary Examiner* — Manuel L Barbee
(74) *Attorney, Agent, or Firm* — Crowell & Moring LLP

(57) ABSTRACT

A distributed-generator power-generation-amount estimation apparatus and method capable of more accurately and easily estimating output by reflecting a power factor are disclosed. The apparatus estimates a power generation amount of a distributed generator interconnected to an electric power system from active power and reactive power measured at regular intervals by measurement means, the apparatus including power-factor estimation means for estimating, as a ratio of a time change amount of the active power and the reactive power, a power factor of the distributed generator interconnected to a demand side of the electric power system, distributed-generator power-genera- (Continued)

tion-amount estimation means for having, from active power and reactive power measured at a time of no power when the distributed generator interconnected to the electric power system is not generating power, a first characteristic line representing a load characteristic on a coordinate plane based on active power and reactive power, a second characteristic line representing a distributed-generator characteristic on the coordinate plane, and estimating the difference between the active power and the reactive power at an intersection point of the first characteristic line and the second characteristic line, and the measured active power and the measured reactive power as the power generation amount of the distributed generator, and output means for outputting power-generation-amount estimation information on the distributed generator estimated by the distributed-generator power-generation-amount estimation means.

11 Claims, 12 Drawing Sheets

(51) Int. Cl.
*H02J 3/00* (2006.01)
*H02J 3/18* (2006.01)

(52) U.S. Cl.
CPC ........... *H02J 2203/20* (2020.01); *Y02E 40/30* (2013.01); *Y02E 60/76* (2013.01); *Y04S 40/22* (2013.01)

(56) References Cited

FOREIGN PATENT DOCUMENTS

| | | |
|---|---|---|
| JP | 2012-55061 A | 3/2012 |
| JP | 2012-95478 A | 5/2012 |
| JP | 2014-200167 A | 10/2014 |

OTHER PUBLICATIONS

Japanese-language Written Opinion (PCT/ISA/237) issued in PCT Application No. PCT/JP2016/067945 dated Aug. 30, 2016 (three pages).

Matsuda et al., "Bunsangata Dengen no Untenjoukyou Suiteisyuhou no Teian", IEEJ Transactions on Power and Energy, Jan. 22, 2010, pp. 1-22, vol. 130, No. 6.

\* cited by examiner

FIG. 2

ESTIMATION CONDITION SETTING — I1

POWER-GENERATION-AMOUNT ESTIMATION CYCLE: 10 SECONDS

TIDAL-CURRENT-MEASUREMENT-VALUE INTERVAL FOR ESTIMATING POWER FACTOR: 10 SECONDS

NORMAL RANGE OF POWER-FACTOR ESTIMATION VALUE — I2

NORMAL RANGE  UPPER LIMIT VALUE: 1.0

LOWER LIMIT VALUE: 0.5

ACTUAL DATA EXTRACTING RANGE FOR CONFIRMING HISTORY — I3

2015 YEAR 08 MONTH 01 DATE 12 HOUR 00 MINUTE TO

2015 YEAR 08 MONTH 01 DATE 12 HOUR 30 MINUTE FROM

FIG. 4
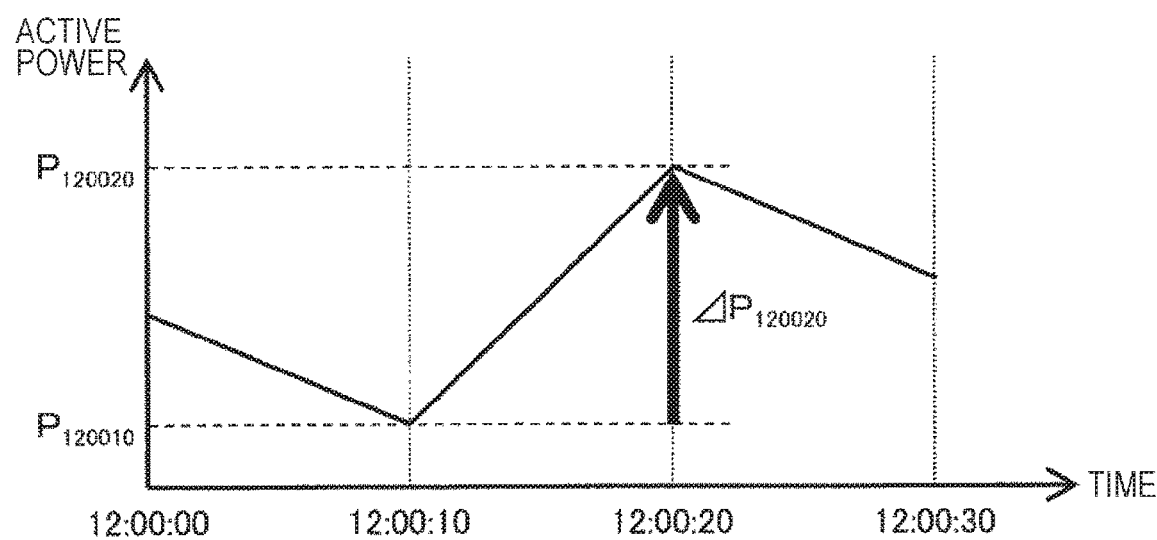
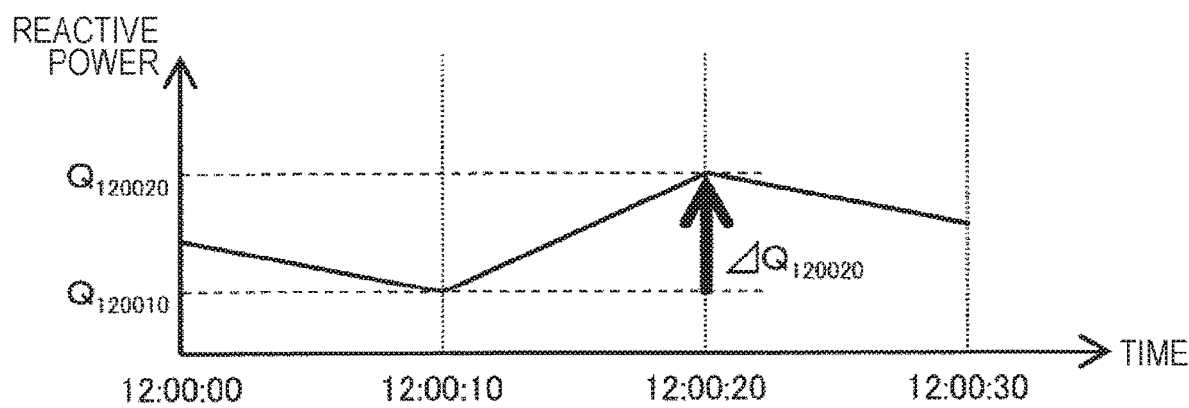

| YEAR-MONTH-DATE-HOUR-MINUTE-SECOND | ACTIVE POWER | REACTIVE POWER | POWER FACTOR |
|---|---|---|---|
| 2015-08-01-12-00-00 | $P_{20150801120000}$ | $Q_{20150801120000}$ | $PF_{20150801120000}$ |
| 2015-08-01-12-00-10 | $P_{20150801120010}$ | $Q_{20150801120010}$ | $PF_{20150801120000}$ |
| 2015-08-01-12-00-20 | $P_{20150801120020}$ | $Q_{20150801120020}$ | $PF_{20150801120020}$ |

DB4

DISTRIBUTED-GENERATOR POWER-GENERATION-AMOUNT ESTIMATION APPARATUS AND METHOD

TECHNICAL FIELD

The present invention relates to a distributed-generator power-generation-amount estimation apparatus and method.

BACKGROUND ART

In recent years, the interconnection amount of distributed generators DG including photovoltaic power generation to an electric power system is increasing for the purpose of protecting the global environment. On the other hand, a distributed generator DG has a risk of sudden change in power generation due to weather such as clouds and wind. Power companies have a need to know the output of the distributed generator DG frequently, such as at intervals of several seconds, and precisely in order to stably supply electric power.

As a conventional technique, Non-Patent Document 1 discloses a technique for estimating output of a distributed generator DG. The document discloses a method for estimating output of a distributed generator DG by using a power-factor method.

In the estimation of the output of a distributed generator DG by the power factor method, by assuming a coordinate plane in which the abscissa is active power P and the ordinate is reactive power Q, putting plots on the PQ coordinate plane according to the active power P and reactive power Q measured in units of banks of a substation or the like while the distributed generator DG is stopped, and performing, for example, linear approximation processing based on these plots, a load characteristic of the electric power system is specified in advance. This load characteristic is a characteristic when there is no distributed generator in the electric power system.

Next, plots are put on the above active power/reactive power coordinate plane according to real time active power P and reactive power Q (measured, for example, at 10-second intervals) measured in units of banks of the substation or the like. Supposing that the distributed generator DG operates at a power factor of 1, the distributed generator DG outputs only active power. Therefore, when it is assuming that the real-time active power measurement value is $P_1$ and the real-time reactive power measurement value is $Q_1$, the output of the distributed generator DG is calculated by Formula (1).

[Mathematical Formula 1]

output of distributed generator $DG$=active power $P_0$ obtained from load characteristic when reactive power is $Q1$−measured real time active power $P_1$ (1)

The advantage of the power-factor method is that it is possible to calculate the output of the distributed generator DG at that point each time active power and reactive power is measured in units of banks of a substation or the like, and then it is possible to estimate the output of the distributed generator DG frequently.

Measurement of active power and reactive power in units of banks of a substation means that active power and reactive power in an electric-power supplying target area connected via a feeder (distribution line) to the bank. For this reason, the estimation of the power generation amount means to estimate the power generation amount of the distributed generator in units of areas.

CITATION LIST

Non Patent Literature

NPL 1: Matsuda et al., "Bunsangata Dengen no Untenjoukyou Suiteisyuhou no Teian" IEEJ Transactions on Power and Energy, Vol. 130 No. 6 Pages 593-602 (2010)

SUMMARY OF INVENTION

Technical Problem

In the method disclosed in Non-Patent Document 1, since the power generation amount of the distributed generator DG is estimated based on the assumption that the power factor of the distributed generator DG is 1, there is a problem that an error is included in the power-generation-amount estimation value of the distributed generator DG in the case where the distributed generator DG is operated at a power factor other than 1.

On the other hand, since it is generally assumed that a power factor of a distributed generator DG is other than 1, it is desirable to calculate the power factor of the distributed generator DG and use it for estimating the output of the distributed generator DG.

In view of the above, the present invention is to provide a distributed-generator power-generation-amount estimation apparatus and method that can estimate output more precisely and easily by reflecting a power factor.

Solution to Problem

In order to solve the above problem, a configuration described in, for example, claims is adopted. The present invention includes a plurality of means for solving the above problem, and is, for example, a distributed-generator power-generation-amount estimation apparatus that estimates, from active power and reactive power measured at regular intervals by measurement means installed on an electric power system, a power generation amount of a distributed generator interconnected the an electric power system, the distributed-generator power-generation-amount estimation apparatus including power-factor estimation means for estimating, as a ratio of a time change amount of the active power and the reactive power, a power factor of the distributed generator interconnected to a demand side of the electric power system from a measurement point by the measurement means, distributed-generator power-generation-amount estimation means for having, from active power and reactive power measured at a time of no power when the distributed generator interconnected to the electric power system is not generating power, a first characteristic line representing a load characteristic on a coordinate plane based on active power and reactive power, determining, from the measured active power, the measured reactive power, and the power factor of the distributed generator, a second characteristic line representing a distributed-generator characteristic on the coordinate plane, and estimating the difference between the active power and the reactive power at an intersection point of the first characteristic line and the second characteristic line, and the measured active power and the measured reactive power as the power generation amount of the distributed generator, and output means for outputting power-generation-amount estimation information on the distributed generator estimated by the distributed-generator power-generation-amount estimation means.

Furthermore, a distributed-generator power-generation-amount estimation method for estimating, from active power and reactive power measured at regular intervals by measurement means installed on an electric power system, a power generation amount of a distributed generator interconnected to the electric power system, the distributed-generator power-generation-amount estimation method includes estimating, as a ratio of a time change amount of the active power and the reactive power, a power factor of the distributed generator interconnected to a demand side of the electric power system from a measurement point by the measurement means, and obtaining, from active power and reactive power measured at a time of no power when the distributed generator interconnected to the electric power system is not generating power, a first characteristic line representing a load characteristic on a coordinate plane based on active power and reactive power, obtaining, from the measured active power, the measured reactive power, and the power factor of the distributed generator, a second characteristic line representing a distributed-generator characteristic on the coordinate plane, and estimating the difference between the active power and the reactive power at an intersection point of the first characteristic line and the second characteristic line, and the measured active power and the measured reactive power as the power generation amount of the distributed generator.

Advantageous Effects of Invention

According to the present invention, it is possible to more accurately and easily estimate a power generation amount of a distributed generator DG as compared with a conventional technique.

Thus, according to an embodiment of the present invention, a business entity operating an electric power system can prepare the setting states of the facilities in the electric power system in appropriate states so as to handle any sudden change in the power generation amount of the distributed generator DG at any time. Accordingly, it is possible to increase the interconnection amount of a distributed generator DG to an electric power system, and to improve the electric power quality more than before when the power generation amount of the distributed generator DG suddenly changes.

BRIEF DESCRIPTION OF DRAWINGS

FIG. 2 is a diagram showing an example of a display screen for inputting handled by an input function I.

FIG. 4 is a diagram showing an image of processing in a power-factor estimation function C1.

DESCRIPTION OF EMBODIMENTS

An Embodiment of the present invention will be described below with reference to the drawings.

Embodiment

Figure 1:
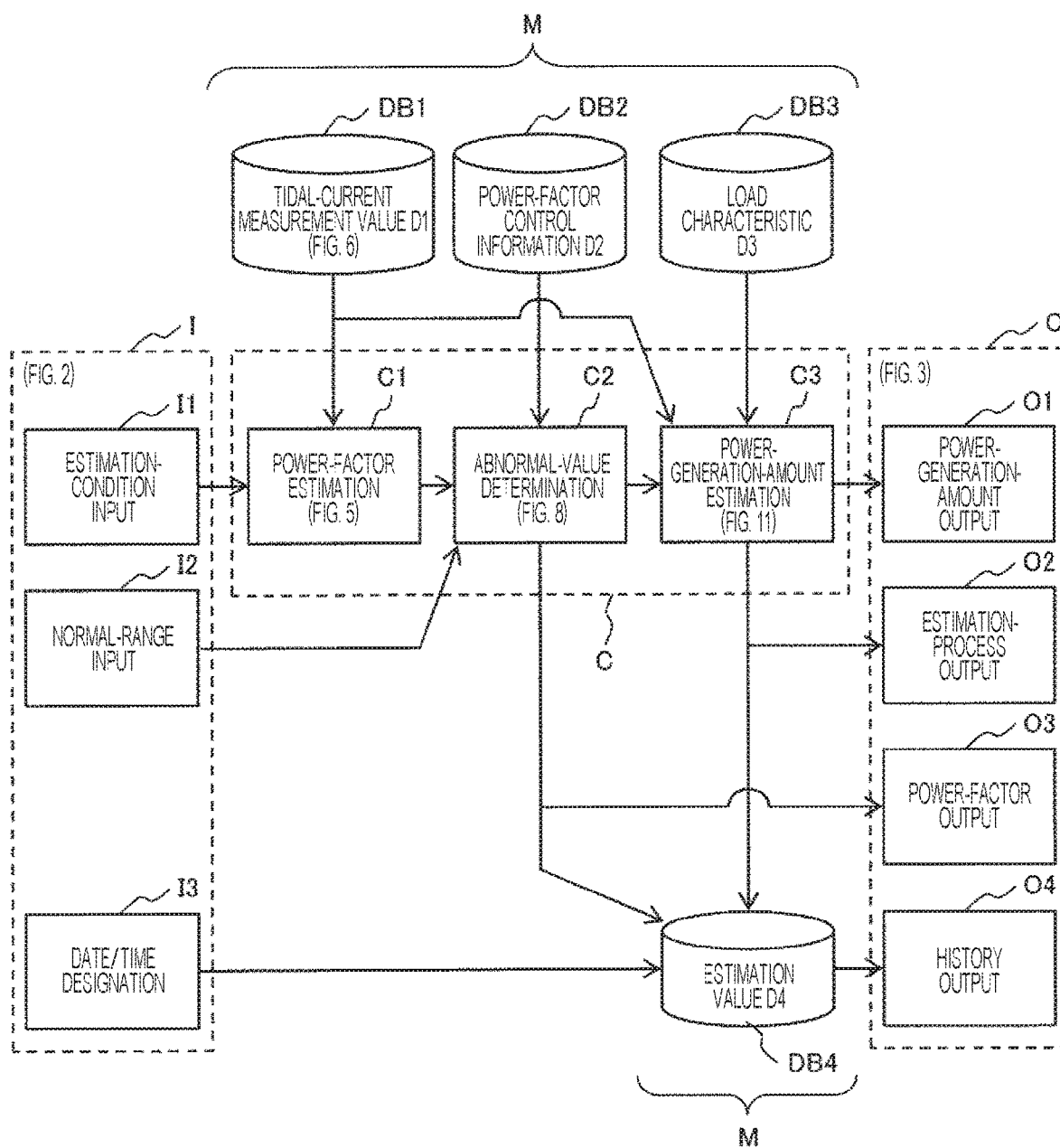
FIG. 1 is a diagram showing an entire configuration of an area-unit distributed-generator power-generation-amount estimation apparatus.

FIG. 1 shows an entire configuration of an area-unit distributed-generator power-generation-amount estimation apparatus. This apparatus is implemented by a general computer including an input function I, an output function O, a calculation function C, and a storage function M. First, the outline of the entire apparatus will be described.

In the input function I, a setting condition used particularly in the calculation function C of the area-unit distributed-generator power-generation-amount estimation apparatus is defined. The input function I includes an estimation-condition input function I1, a normal-range input function I2, and a date/time designation function I3. The estimation-condition input function I1 is used for inputting a setting condition for estimating a power generation amount of a distributed generator DG. The normal-range input function I2 is used for determining whether a power-factor estimation value of the distributed generator DG is an abnormal value. The date/time designation function I3 is used for setting the date and time when data is extracted from a database to verify estimation values of the power factor or the power generation of the distributed generator DG in the past. The input function I will be described later with reference to FIG. 2.

The output function O includes a power-generation-amount output function O1, an estimation-process output function O2, a power-factor output function O3, and a history output function O4. The power-generation-amount output function O1 is used for outputting an estimation value of the power generation amount of the distributed generator DG. The estimation-process output function O2 is used for outputting a calculation process of estimating the power generation amount of the distributed generator DG as an image. The power-factor output function O3 is used for outputting a power-factor estimation value of the distributed generator DG. The history output function O4 is used for outputting actual data of the estimation values of the power factor and the power generation amount of the distributed generator DG. The output function O will be described later with reference to FIG. 3.

The storage function M is configured, for example, as a database DB, and includes a tidal-current-measurement-value database DB1, a power-factor-control-information database DB2, a load-characteristic database DB3, and an estimation-value database DB4. The tidal-current-measurement-value database DB1 stores a measurement value D1 of a tidal current. The power-factor-control-information database DB2 contains power-factor control information D2. The load-characteristic database DB3 contains load-characteristic data D3. The estimation-value database DB4 stores an estimation value D4 of a calculation result. The power-factor-control-information database DB2 stores a power-factor instruction value when a control function (not shown) of the electric power system controls a power factor of the distributed generator DG in real time.

The calculation function C includes a power-factor estimation function C1, an abnormal-value determination function C2, and a power-generation-amount estimation function C3.

The power-factor estimation function C1 estimates, from the estimation condition received from the estimation-condition input function I1 and a tidal-current measurement value D1 (active power and reactive power) measured in the electric power system and stored in the tidal-current-measurement-value database DB1, a power factor as a whole including a plurality of distributed generators DG on the downstream of the measurement point of the tidal-current measurement value, and outputs the power factor to the abnormal-value determination function C2. When the power generation amount of distributed generators in units of areas is estimated, the tidal-current measurement value D1 (active power and reactive power) is set as the bank installation position of the substation in the electric power system. The power-factor estimation function C1 will be described later with reference to FIG. 5.

The abnormal-value determination function C2 determines, based on the information on the power-factor normal range input by the normal-range input function I2, whether the power-factor estimation value output by the power-factor estimation function C1 is within the normal range. Incidentally, the power-factor-control-information database DB2 stores a power-factor instruction value when the control function of the electric power system controls a power factor of the distributed generator DG in real time. When the power-factor control value at the current time is stored in the power-factor-control-information database DB2, the abnormal-value determination function C2 replaces the power-factor estimation value with the power-factor control value, and determines whether the power-factor control value is within the normal range. The power-factor estimation value after the determination is output to the power-generation-amount estimation function C3, the power-factor output function O3, and the estimation-value database DB4. The abnormal-value determination function C2 will be described later with reference to FIG. 8.

The power-generation-amount estimation function C3 estimates, from power-factor information output by the abnormal-value determination function C2, load-characteristic information D3 of the load-characteristic database DB3, and tidal-current-measurement-value information D1 of the tidal-current-measurement-value database DB1, the power generation amount (active power and reactive power) of all the distributed generators DG on the downstream of the tidal-current measurement point. The information on the estimated power generation amount is output to the power-generation-amount output function O1 and the estimation-value database DB4. The image of the calculation process is output to an estimation-process output function O3 so that the operator can visually understand the calculation process in the power-generation-amount estimation function C3. The power-generation-amount estimation function C3 will be described later with reference to FIG. 11.

Among the information of the power-factor estimation value and the power-generation estimation value of the distributed generator DG recorded in the estimation-value database DB4, the data matching the period output by the date/time designation function I3 is output to the history output function O4.

Hereinafter, the processing of each function will be described in detail.

FIG. 2 is a diagram showing an example of a display screen for inputting handled by the input function I. The input function I includes the estimation-condition input function I1, the normal-range input function I2, and the date/time designation function I3.

The estimation-condition input function I1 sets a power-generation-amount estimation cycle and a tidal-current-measurement-value interval for estimating a power factor. The power-generation-amount estimation cycle is a function for setting an interval for executing the estimation processing of the power generation amount of the distributed generator DG interconnecting to the electric power system. In this example, it is assumed that the processing is performed at a 10-second cycle. The tidal-current-measurement-value interval for estimating a power factor is a function for setting a time interval of measurement data, which is tidal-current data (active power and reactive power) measured at another time, from which the power factor of the distributed generator DG is estimated. In this example, it is assumed that the processing is performed at a 10-second cycle.

The normal-range input function I2 designates, as the power-factor estimation value of the distributed generator DG, the normal range in advance. In this example, the normal range is designated as the upper limit of 1.0 and the lower limit of 0.5.

The date/time designation function I3 is a function for setting, when the operator refers to the actual data of the power-factor estimation value of the distributed generator DG and of the power-generation-amount estimation value of the distributed generator DG, the reference period. In the illustrated example, 30 minutes from 12:00 on Aug. 1, 2015 to 12:30 on the same day are designated as the reference period. In FIG. 2, the method of inputting the values in the above functions I1, I2, and I3 is shown as a pull-down system as an example, but the setting method is not limited to this system.

Figure 3:
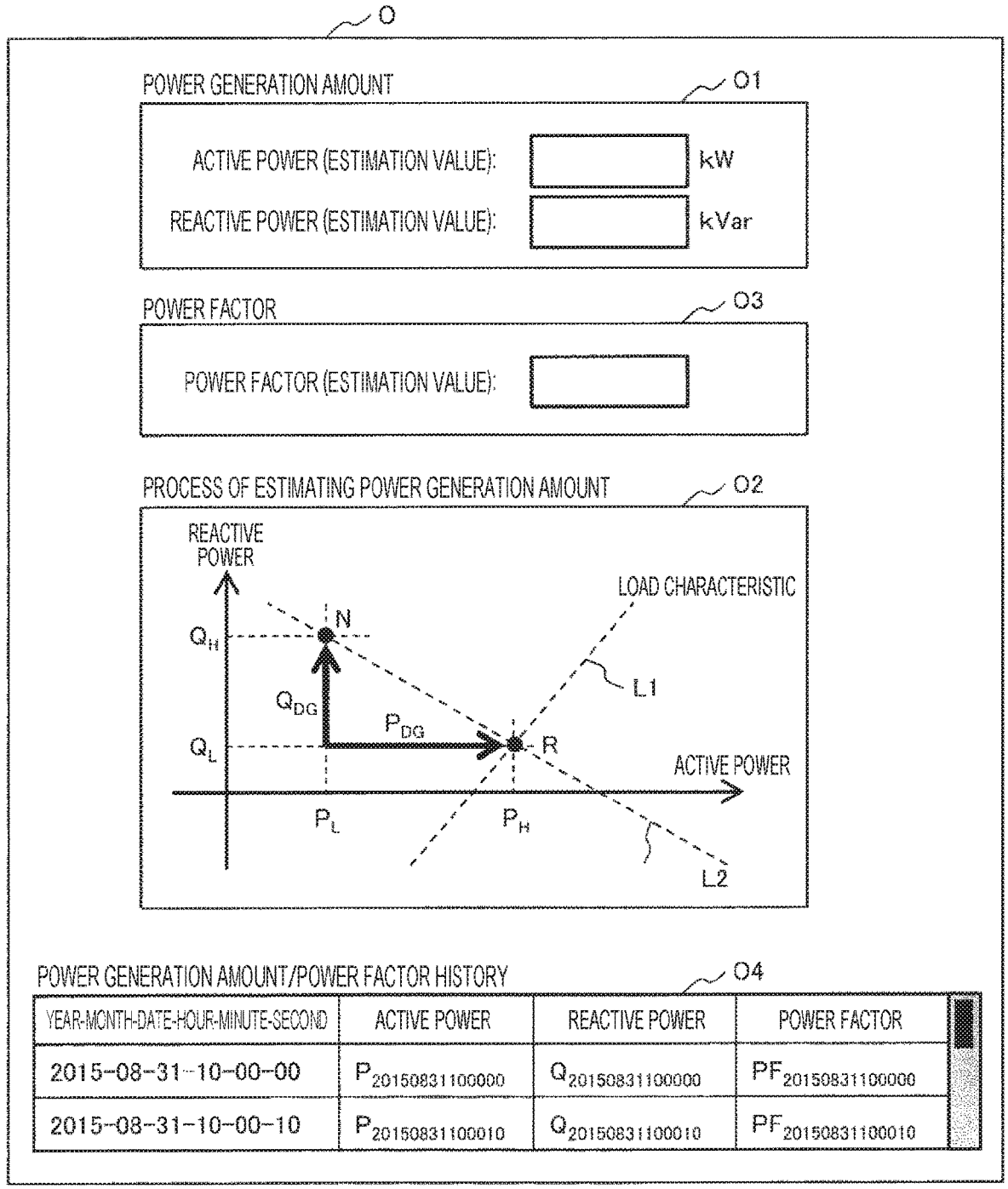
FIG. 3 is a diagram showing an example of a display screen for outputting handled by an output function O.

FIG. 3 is a diagram showing an example of a display screen for outputting handled by the output function O. The output function O includes the power-generation-amount output function O1, the estimation-process output function O2, the power-factor output function O3, and the history output function O4.

The power-generation-amount output function O1 is a function for outputting power-generation-amount prediction values (active power estimation value Kw and reactive power estimation value KVar) of the distributed generator DG output by the power-generation-amount estimation function C3 as a numerical value or graph.

The estimation-process output function O2 is a function for visually displaying the process in which the power-generation-amount estimation function C3 estimates the power generation amount of the distributed generator DG. In the illustrated example, the process is displayed on the coordinate plane based on the active power and the reactive power.

The power-factor output function O3 is a function for displaying the power-factor estimation value output by the abnormal-value determination function C2 as a numerical value or graph.

The history output function O4 is a function for displaying data of a period designated by the date/time designation function I3 from the past power-factor estimation value of the distributed generator DG and power-generation-amount estimation value of the distributed generator DG that are stored in the estimation-value database DB4. In the illustrated example, the active power, the reactive power, and the power factor for 30 minutes from 12:00 on Aug. 1, 2015 to 12:30 on the same day designated by date/time designation function I3 are displayed as numerical values.

FIG. 4 is a diagram showing an image of processing in the power-factor estimation function C1. The upper part of FIG. 4 shows the time-series waveform of the active power measured in the electric power system, and the lower part of FIG. 4 shows the time-series waveform of the reactive power waveform measured at the same measurement point of the electric power system. In this drawing, it is assumed that the active power and the reactive power are measured at intervals of 10 seconds as an example, and the graph shows time-series measured values from 12:00:00 to 12:00:30.

Here, the fluctuation manner of the active power P and the reactive power Q measured in the electric power system is based on that the fluctuation in the load of the consumer interconnected to the system overlaps with the fluctuation in the output of the distributed generator DG. In the present invention, the fluctuation in the active power P and the reactive power Q is caused by that the fluctuation in the load of the customer overlaps with the fluctuation in the output of the distributed generator DG, but that the output of the distributed generator DG generally fluctuates more abruptly than the fluctuation in the load of the consumer is focused on. In other words, if it is limited to a very short time window (several seconds to several tens of seconds), it can be assumed that the change in the load of the consumer is almost 0, and, thus, the change in the active power and the reactive power in this time window is caused by the output of the distributed generator DG. Therefore, by showing the measurement data of 30 seconds from 12:00:00 to 12:00:30 in FIG. 4, the fluctuation due to the output of the distributed generator DG alone is indicated.

FIG. 4 shows an example in which the active power changes by ΔP and the reactive power changes by ΔQ for the seconds from 12:00:10 to 12:00:20. From the above concept, ΔP and ΔQ can be regarded as the fluctuation amount of the power generation amount of the distributed generator DG. Here, the ratio of the magnitude of ΔP and ΔQ is determined by the power factor as a whole including all the distributed generators DG interconnected to the downstream of the measurement point of the active power and the reactive power. That is, from ΔP and ΔQ, the power factor as a whole can be estimated by Formula (2).

[Mathematical Formula 2]

$$\text{Power-factor estimation value} = \cos(\tan^{-1}(\Delta Q/\Delta P)) \quad (2)$$

Where ΔP is the difference in the active power (kW) measured at different times and ΔQ is also the difference in reactive power (kvar). The time intervals for calculating ΔP of the active power and ΔQ of the reactive power are the same, and the timings are also the same. In short, this processing is to determine the power factor from the ratio of the time change amount of the active power and the reactive power.

Figure 5:
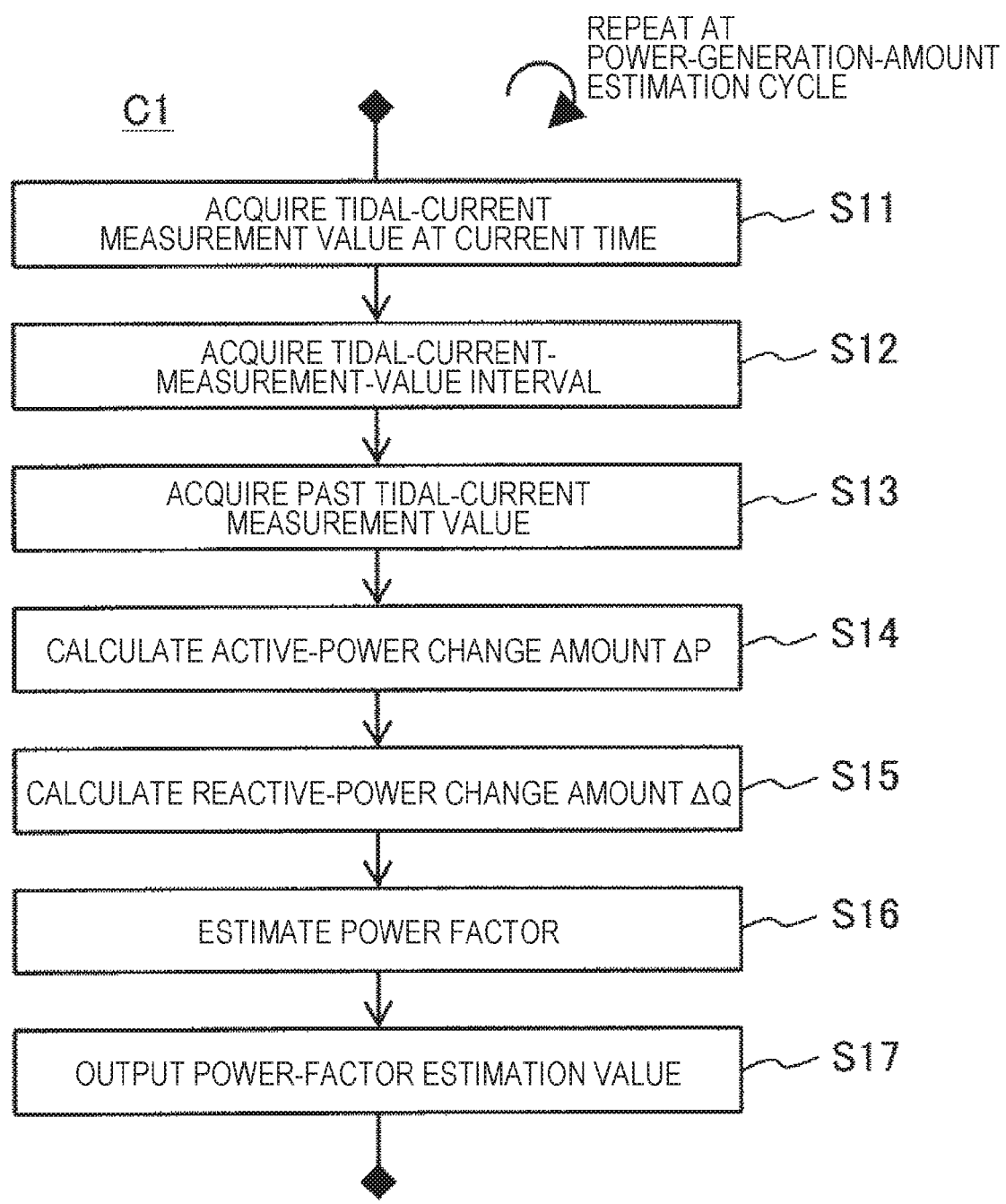
FIG. 5 is a flowchart showing a processing procedure of the power-factor estimation function C1.

FIG. 5 is a flowchart showing a processing procedure of the power-factor estimation function C1. This flowchart is executed in accordance with an estimated cycle of the power generation amount of the distributed generator DG. The value of the estimated cycle of the power generation amount of the distributed generator DG is the value of the power-generation-amount estimation cycle of the estimation-condition input function I1.

Figure 6:
FIG. 6 is a diagram showing table definitions of a tidal-current-measurement-value database DB1.

In the first processing step S11, a tidal-current measurement value at the current time is acquired. In this processing, the measurement values of the active power and the reactive power at the current time are acquired by referring to the tidal-current-measurement-value database DB1. FIG. 6 shows table definitions of the tidal-current-measurement-value database DB1. The database DB1 stores the measurement values of the active power and the reactive power corresponding to the date and time in real time.

In the next processing step S12 in FIG. 5, the tidal-current-measurement-value interval is acquired. The tidal-current-measurement-value interval is a time width for calculating ΔP and ΔQ later. As the value of the tidal-current-measurement-value interval, the value of the tidal-current-measurement-value interval for estimating a power factor of the estimation-condition input function I1 is used.

In the processing step S13, a past tidal-current measurement value is acquired. Here, the active power and the reactive power at the time going back by the time length acquired in the processing step S12 from the current time are acquired from the tidal-current-measurement-value database DB1.

In the processing step S14, the active-power change amount ΔP is calculated. ΔP is calculated by Formula (3).

[Mathematical Formula 3]

$$\Delta P = P_t - P_{t-\Delta t} \quad (3)$$

Where, $P_t$ is the active power at the current time, and $P_{t-\Delta t}$ is the active power measured at a certain past time.

In the processing step S15, the reactive-power change amount ΔQ is calculated. ΔQ is calculated by Formula (4).

[Mathematical Formula 4]

$$\Delta Q = Q_t - Q_{t-\Delta t} \quad (4)$$

Where, $Q_t$ is the reactive power at the current time, and $Q_{t-\Delta t}$ is the reactive power measured at a certain past time.

The processing step S16 is a power-factor estimation function. This function calculates the power-factor estimation value using ΔP and ΔQ by Formula (2).

The processing step S17 is output processing of the power-factor estimation value. In this processing, the power-factor estimation value at the current time determined in the processing steps S14, S15, and S16 is output to the abnormal-value determination function C2.

In this embodiment, ΔP is compared with the reference value in processing step S15, but it is also possible to compare ΔQ with the reference value or to compare both ΔP and ΔQ with the reference value.

Figure 7:
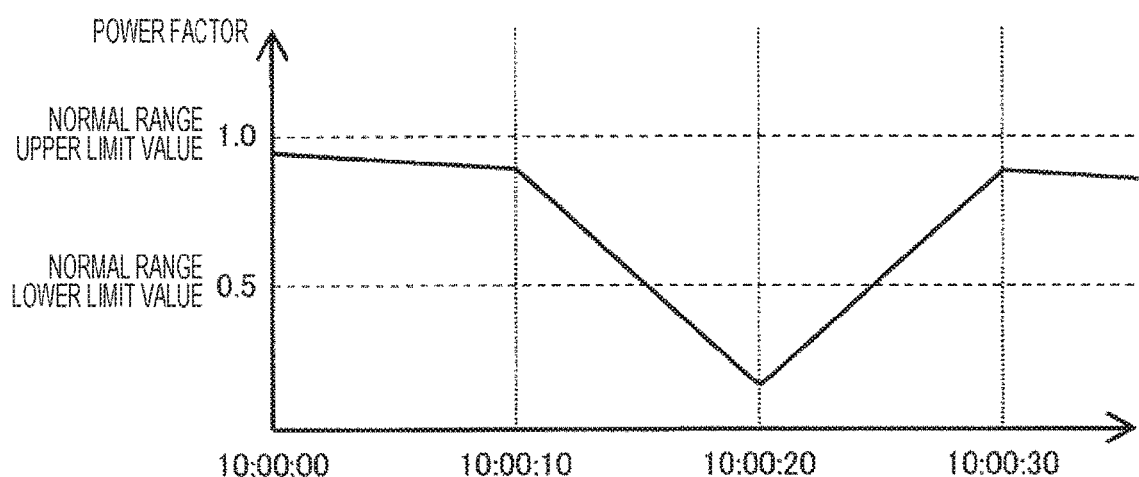
FIG. 7 is a diagram showing an image of processing in an abnormal-value determination function C2.

FIG. 7 is a diagram showing an image of processing in the abnormal-value determination function C2. Here, a graph of the power-factor estimation value corresponding to time is shown. The upper limit value 1.0 and the lower limit value 0.5 of the normal range of the power factor are also indicated. In this drawing, the power-factor estimation value at 10:00:20 departs from the lower limit value of 0.5 of the normal range. Therefore, the function C2 determines that the power-factor estimation value at that time is an abnormal value.

Figure 8:
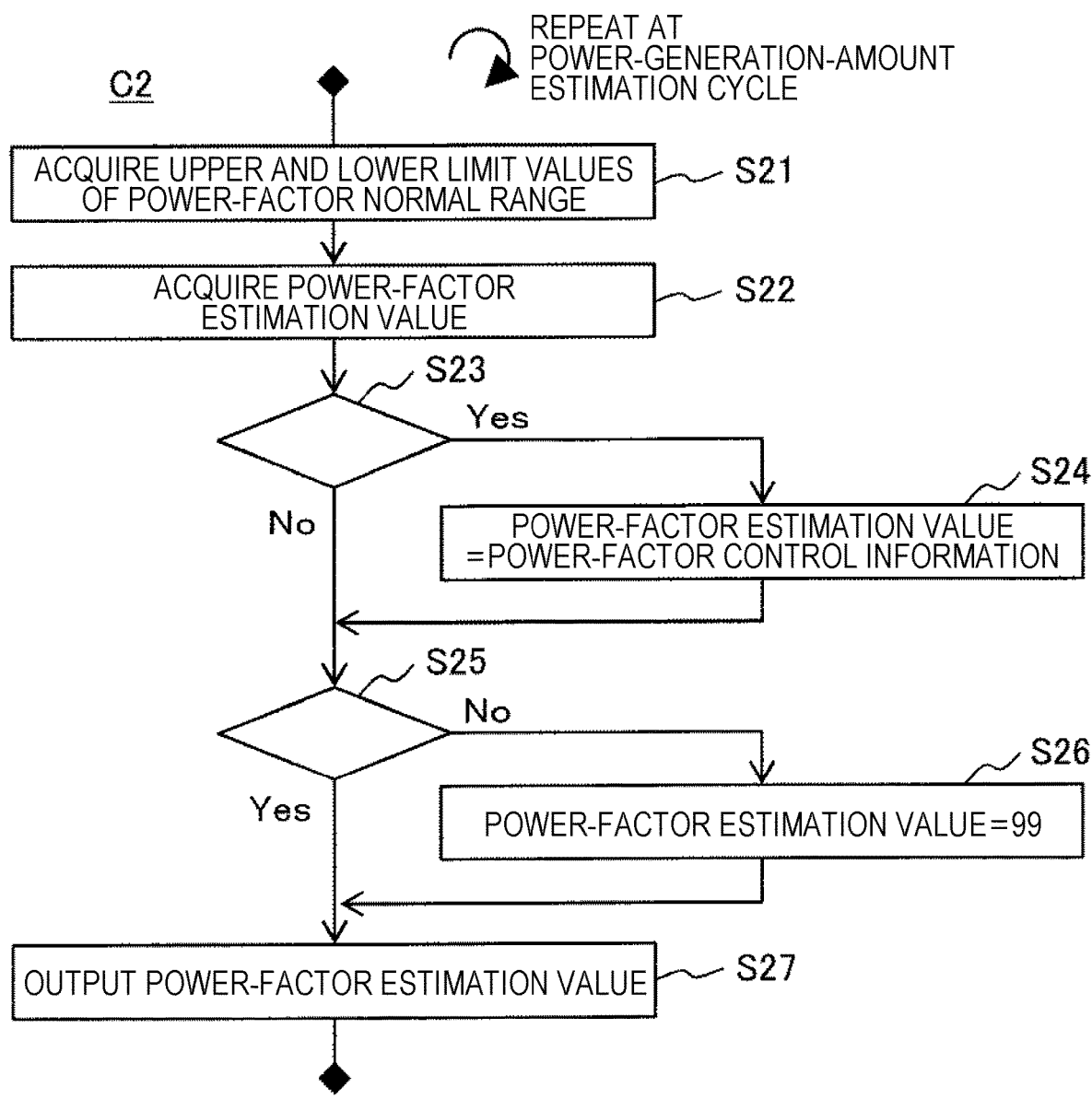
FIG. 8 is a flowchart showing a processing procedure of the abnormal-value determination function C2.

FIG. 8 is a flowchart showing a processing procedure of the abnormal-value determination function C2. This flowchart is executed in accordance with an estimated cycle of the power generation amount of the distributed generator DG. The value of the estimated cycle of the power generation amount of the distributed generator DG is the value of the power-generation-amount estimation cycle of the estimation-condition input function I1.

In the first processing step S21 in FIG. 8, the upper and lower limit values of the power-factor normal range are acquired. The upper limit value 1.0 and the lower limit value 0.5 of the power-factor normal range are the set values of the normal-range input function I2.

In the processing step S22, a power-factor estimation value is acquired. The power-factor estimation value is acquired from the power-factor estimation function C1.

Figure 9:
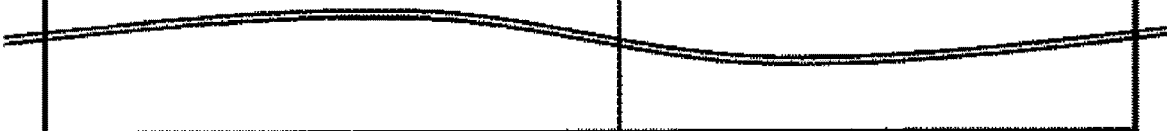
FIG. 9 is a diagram showing table definitions of a power-factor-control-information database DB2.

The processing step S23 is a branching function for determining whether there is power-factor control information at the current time. The power-factor control information referred in this description is information on the power-factor instruction amount in a case where the control system of the electric power system performs control to intentionally lower the power factor of the distributed generator DG in order to stably supply electric power. The power-factor-control-information database DB2 is referred to in order to recognize whether there is the power-factor control information, and the magnitude thereof. Here, FIG. 9 shows table definitions of the power-factor-control-information database DB2, and that a power-factor instruction value corresponding to the year, month, day and time when the control system in the electric power system has performed power-factor control is recorded. The data at the time when the control system in the electric power system has not performed the power-factor control of the distributed generator DG is not recorded in this table.

In the processing step S23, the power-factor-control-information database DB2 is referred to in order to confirm whether there is power-factor control information at the current time. When there is power-factor control information at the current time, the processing proceeds to the processing step S24, and the power-factor estimation value received from the power-factor estimation function C1 is replaced with the value recorded in the power-factor-control-information database DB2. On the other hand, when there is no power factor control information at the current time in the power-factor-control-information database DB2, the processing proceeds from the processing step S23 to the processing step S25.

In the processing step S25, it is determined whether the power-factor estimation value is within the normal range. When Formula (5) is satisfied at this function, the power-factor estimation value is determined to be a normal value, or when Formula (5) is not satisfied, the power-factor estimation value is determined to be an abnormal value.

[Mathematical Formula 5]

Lower limit value of power-factor normal range-
≤power-factor estimation value≤upper limit
value of power-factor normal range   (5)

Where, the lower limit value and the upper limit value of the power-factor normal range are the setting information of the normal-range input function I2. When it is determined that the power-factor estimation value is in the normal range in the processing step S25, the processing proceeds to the processing step S27. On the other hand, when it is determined that the power-factor estimation value is an abnormal value in the processing step S25, "99" is set as the power-factor estimation value in order to indicate that the power factor is an abnormal value in S26.

In the processing step S27, the processing for outputting the power-factor estimation value is performed. The output destinations of the power-factor estimation value are the power-generation-amount estimation function C3, the power-factor output function O3, and the estimation-value database DB4.

Figure 10:
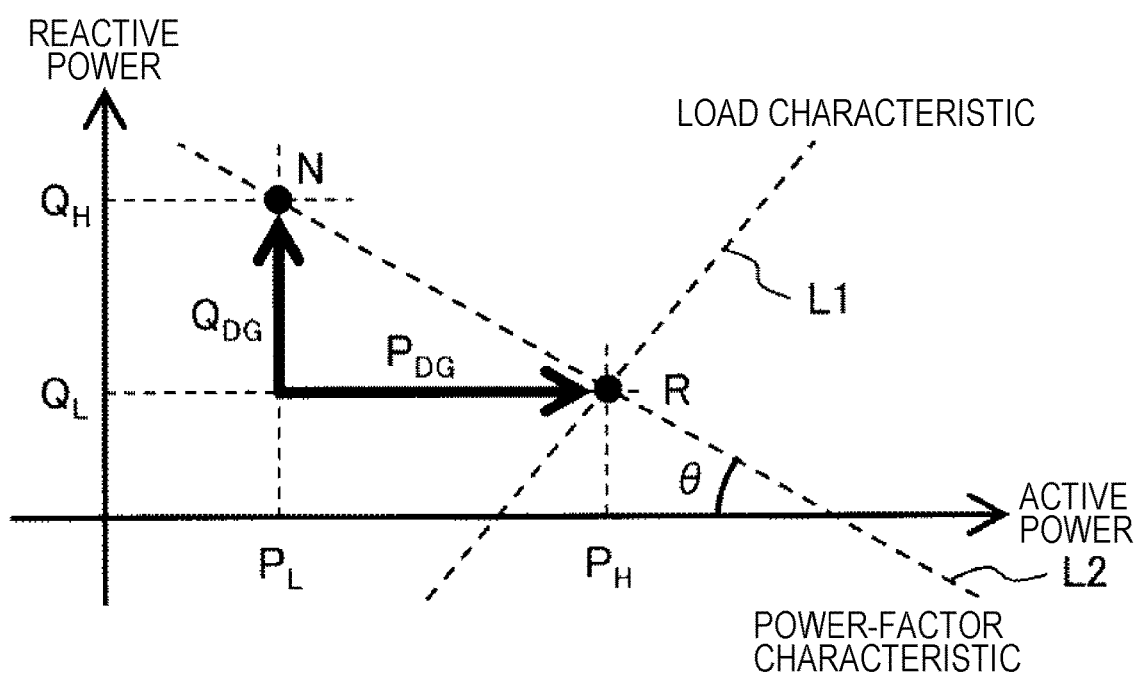
FIG. 10 is a diagram showing an image of processing in a power-generation-amount estimation function C3.

FIG. 10 is a diagram showing an image of processing in the power-generation-amount estimation function C3. FIG. 10 shows a coordinate plane based on the active power P and the reactive power Q. In this processing, the power generation amount of all the distributed generators DG interconnected to the downstream of the measurement point of the active power and the reactive power. As an example of the method, first, a load-characteristic line L1 is drawn on the coordinates of the active power and the reactive power (FIG. 10). The load characteristic referred in this description is the relationship between the active power and the reactive power measured at the previous measurement point when the distributed generator DG is not generating power.

As a technique for obtaining the load-characteristic line L1, the technique described in Non-Patent Document 1 can be applied. By putting plots on the PQ coordinate plane according to the active power P and the reactive power Q measured in units of banks of the substation or the like while the distributed generator DG is stopped and by performing, for example, linear approximation processing based on these plots, the load characteristic of the electric power system can be previously specified. This obtaining method is effective when it can be confirmed that the distributed generator DG is stopped.

In contrast, as an actual operation of the electric power system, if the distributed generator DG only includes photovoltaic power generation, it can be determined that the operation is stopped by obtaining nighttime data, but if the distributed generator DG includes wind power generation, it is necessary to separately confirm nighttime and stoppage of the wind power generation.

As a method for obtaining a line L1 of another load characteristic in consideration of this point, by putting plots on the coordinate plane according to the active power P and the reactive power Q measured in units of banks of the substation or the like in the past without the condition of operation stop, and by performing, for example, linear approximation processing so that the magnitude of the active power P or the reactive power Q is to be maximum in the fourth quadrant (active power P is positive, reactive power Q is negative) in the coordinate plane or in the first quadrant (the active power P and the reactive power Q are positive), the load characteristic of the electric power system can be previously specified.

Next, real-time measurement values of the active power and reactive power are put on the coordinate (indicated as a point N in FIG. 10). Furthermore, a line L2 passing through the point N and having the power factor angle θ of the power-factor estimation value of the distributed generator DG is drawn (here, described as the power-factor characteristic). Then, the intersection point of the load-characteristic line L1 and the power-factor characteristic line L2 is set as R.

Considering the relationship between the point N and the point R, the point R corresponds to the active power and reactive power measured at the measurement point when all the distributed generators DG are not generating power at the current time. On the other hand, the point N is a measurement value, including the power generation effect of the distributed generator DG, of the active power and the reactive power. That is, the divergence width between the point N and the point R is the power generation amount of the distributed generator DG. Thus, the active power component of the power generation amount of the distributed generator DG can be calculated as a value $P_{DG}$ obtained by subtracting the active power $P_L$ at the point C from the active power $P_H$ at the point R. On the other hand, the reactive power component of the power generation amount of the distributed generator DG can be calculated as the value $Q_{DG}$ obtained by subtracting the reactive power $Q_L$ at the point R from the reactive power $Q_H$ at the point N.

Figure 11:
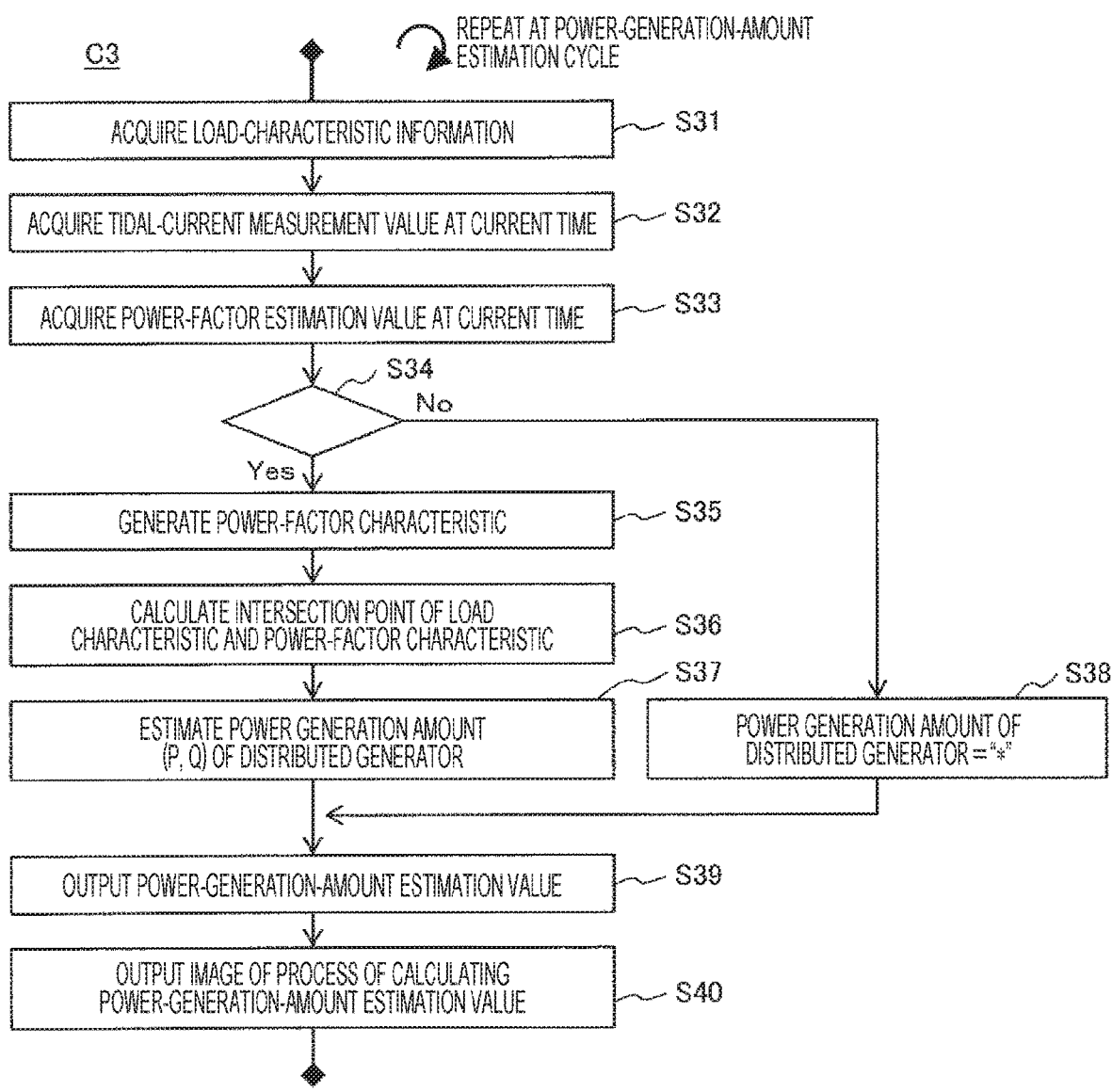
FIG. 11 is a flowchart showing a processing procedure of the power-generation-amount estimation function C3.

FIG. 11 is a flowchart showing a processing procedure of the power-generation-amount estimation function C3. This flowchart is executed in accordance with an estimated cycle of the power generation amount of the distributed generator DG. The value of the estimated cycle of the power generation amount of the distributed generator DG is the value of the power-generation-amount estimation cycle of the estimation-condition input function I1.

Figure 12:
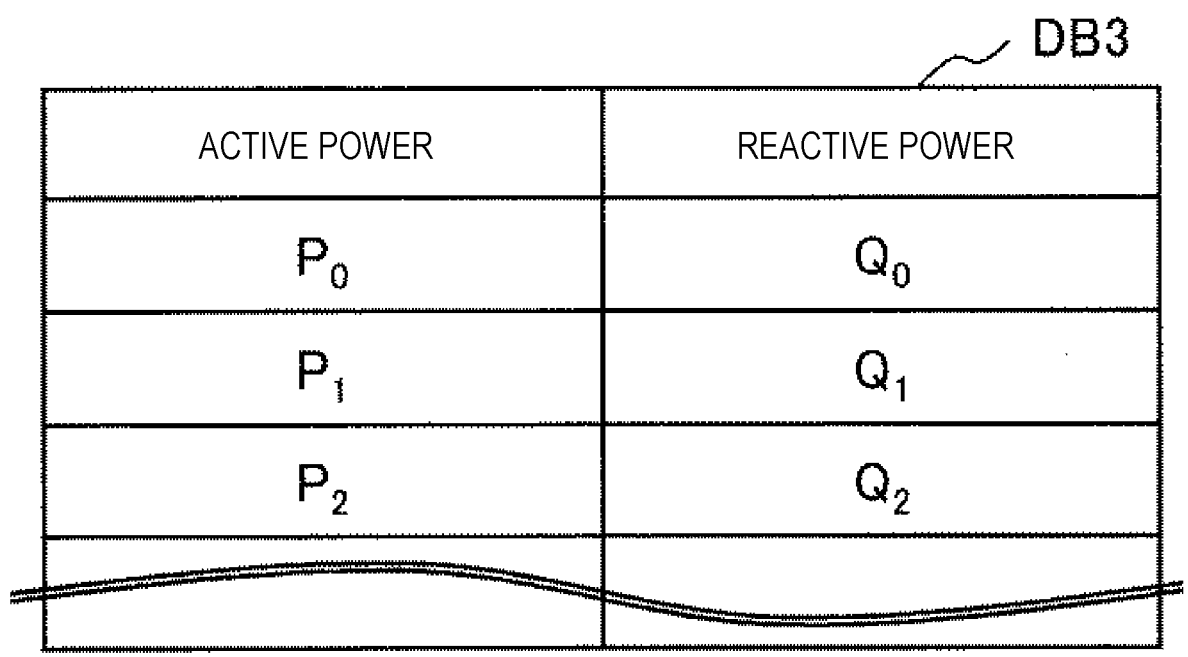
FIG. 12 is a diagram showing table definitions of a load-characteristic database DB3.
Figures 13, 14:
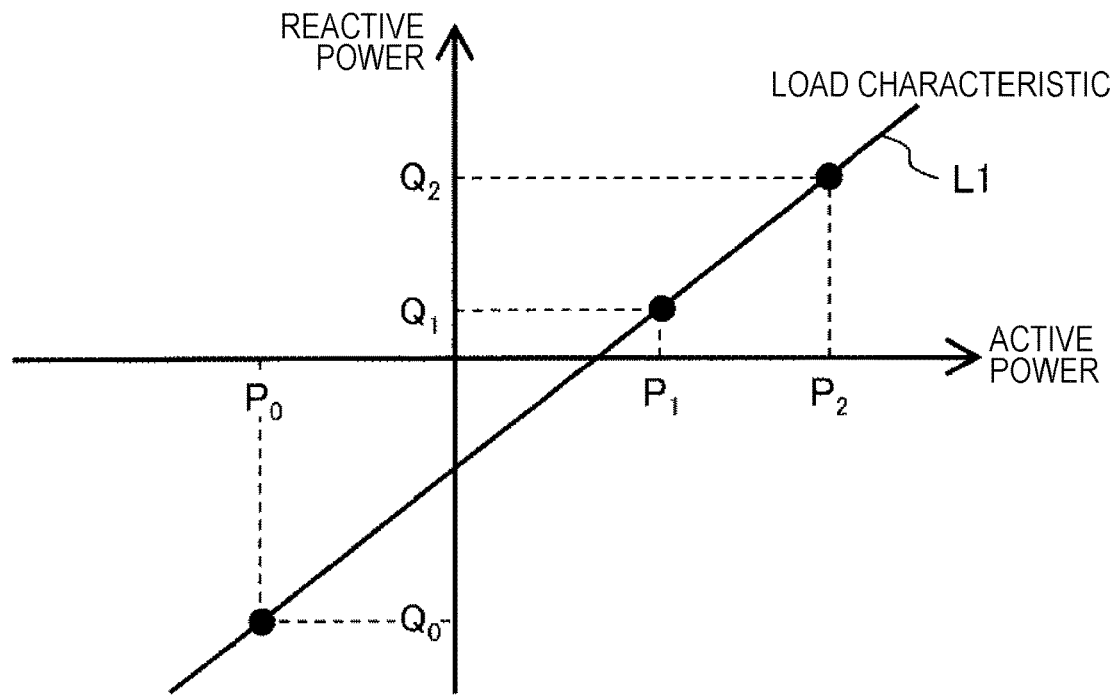
FIG. 13 is a diagram showing an example of data stored in the load-characteristic database DB3.
FIG. 14 is a diagram showing table definitions of an estimation-value database DB4.

In the first processing step S31 in FIG. 11, load-characteristic information is acquired. A load-characteristic information database DB3 is referred to in order to acquire the load-characteristic information. FIG. 13 shows an example of data stored in the load-characteristic database DB3. Here, the load characteristic is defined by a plurality of coordinate points. FIG. 12 shows table definitions of the load-characteristic database DB3. The coordinates (combination of the active power and the reactive power) of the coordinate points defining the load characteristic are recorded. According to FIGS. 12 and 13, the load-characteristic line L1 indicating the relationship between the active power P and the reactive power Q measured in units of banks of the substation or the like while the distributed generator DG is stopped is recorded as the values of PQ at a plurality of points.

In the processing step S31, according to the acquired load-characteristic information, the load-characteristic line L1 is drawn on the active power-reactive power coordinate plane as described in the description of FIG. 10.

In the processing step S32, a measurement value at the current time is acquired. The tidal-current-measurement-value database DB1 is referred to in order to acquire the tidal-current measurement value (active power and reactive power) at the current time.

In the processing step S33, a power-factor estimation value at the current time is acquired. The power-factor estimation value at the current time is acquired from the abnormal-value determination function C2.

The processing step S34 is a branching function for determining whether the power-factor estimation value at the current time is a normal value. That is, when the power-factor estimation value is not "99", the value is determined to be a normal value, and the processing proceeds to the processing step S35. On the other hand, when the power-factor estimation value is "99", the value is determined to be an abnormal value, and the processing proceeds to the processing step S38.

In the processing step S35, a power-factor characteristic is generated. As described in the description of FIG. 10, in addition to putting the real-time tidal-current measurement value acquired in the processing step S32 on the active power-reactive power coordinate plane created in the processing in the processing step S31, a straight line L2 (power-factor characteristic) passing through the point N of the tidal-current measurement value and having an estimated angle θ of the power factor acquired in the processing step S33 is generated.

In the processing step S36, on the active power-reactive power coordinate plane, the coordinates of the intersection point R of the load-characteristic line L1 generated in the processing step S31 and the power-factor characteristic line L2 passing through the point N of the tidal-current measurement value generated in the processing step S35 is calculated.

In the processing step S37, the total power generation amount of the distributed generator DG at the current time is estimated. The magnitude of the active power of the total power generation amount of the distributed generator DG is calculated by Formula (6), and the magnitude of the reactive power is calculated by Formula (7).

[Mathematical Formula 6]

$$\text{Active power generation amount of distributed generator } DG = P_H - P_L \tag{6}$$

[Mathematical Formula 7]

$$\text{Reactive power generation amount of distributed generator } DG = Q_H - Q_L \tag{7}$$

Where, $P_H$ is the active power component (kW) at the coordinates of the intersection point R of the load-characteristic line L1 and the power-factor characteristic line L2, $P_L$ is the active power measurement value (kW) at the current time, $Q_H$ is the reactive power measurement value (kval) at the current time, and $Q_L$ is the reactive power component (kval) at the coordinates of the intersection point R of the load-characteristic line L1 and the power-factor characteristic line L2.

In the processing step S38, since the power-factor estimation value is an abnormal value, the character "*" meaning "unknown" is set as the power generation amount of the distributed generator DG.

In the processing step S39, the processing for outputting the power-generation-amount estimation value is performed. The output destinations of the power-generation-amount estimation value are the power-generation-amount output function O1 and the estimation-value database DB4.

In the processing step S13, an image of the process of calculating the power-generation-amount estimation value is output. In this processing, an image diagram visualizing the processing from the processing steps S31 to S38 (that is, the image of FIG. 10) is generated and outputted to the estimation-process output function O2. An example of the output to the estimation-process output function O2 is shown as O2 in FIG. 3.

FIG. 14 shows table definitions of the estimation-value database DB4. This table stores, for each date and time, the active power component and the reactive power component of the power generation amount of the distributed generator DG, and the power-factor estimation value. From the data recorded in this table, the data corresponding to the period designated by the date/time designation function I3 is output to the history output function O4. Thus, the operator can confirm the validity of the power-generation-amount estimation value of the distributed generator DG in the past.

Figure 15:
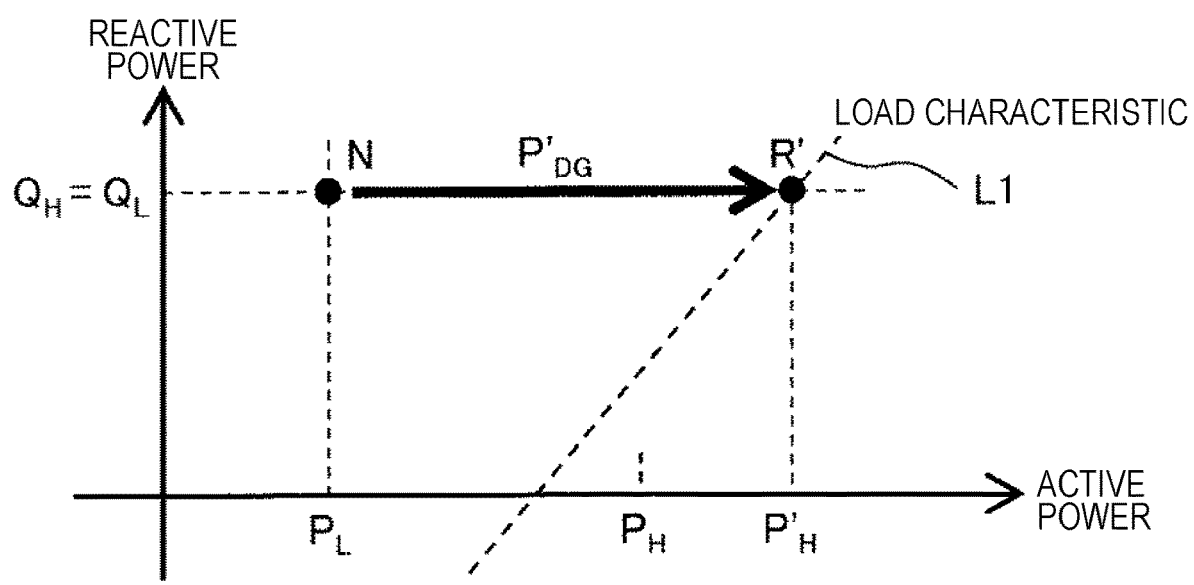
FIG. 15 is a diagram showing an image of processing of a conventional power-generation-amount estimation function.

FIG. 15 is a diagram showing an image of processing of a conventional power-generation-amount estimation function. According to the conventional method, based on the assumption of the power factor 1.0 of the distributed generator DG, the distance from the tidal-current measurement value at the current time (the point N in the drawing) to the intersection point (the point R' in the drawing) of the load characteristic and a straight line passing through the point N and parallel to the X axis is calculated as the output of the distributed generator DG. Thus, the output estimation value is estimated to be larger than the case of using the method shown in FIG. 10. That is, there is a problem that an error can be included since the power factor is not taken into consideration.

According to the present invention, by using the method shown in FIG. 10 in which the power factor of the distributed generator DG is taken into consideration, it is possible to reduce an error of the estimated power generation amount of the distributed generator DG as compared with the conventional method. Accordingly, the present invention has an effect that a business entity operating an electric power system can prepare the setting states of the facilities in the electric power system in appropriate states so as to handle any sudden change in the power generation amount of the distributed generator DG at any time. In addition, the present invention has further effects that the interconnecting amount of the distributed generator DG to the electric power system can be increased and that the power quality can be improved when the power generation amount of the distributed generator DG suddenly changes as compared with the conventional case.

Note that, the present invention is not limited to the above embodiment, and includes various modifications. For example, the above embodiment has been described in detail in order for the present invention to be easily understood, and is not necessarily limited to those having all the described configurations.

REFERENCE SIGNS LIST

I input function
I1 designation condition input function
I2 normal-range input function
I3 date/time designation input function
C1 power-factor estimation function
DB1 tidal-current-measurement-value database
C2 abnormal-value determination function
DB2 power-factor-control-information database
C3 power-generation-amount estimation function
DB3 load-characteristic database
DB4 estimation-value database
O output function
O1 power-generation-amount output function
O2 estimation-process output function
O3 power-factor output function
O4 history output function

The invention claimed is:

1. A distributed-generator power-generation-amount estimation apparatus that estimates, from active power and reactive power measured at regular intervals by measurement means installed on an electric power system, a power generation amount of a distributed generator interconnected to the electric power system, the distributed-generator power-generation-amount estimation apparatus comprising:
power-factor estimation means for estimating, as a ratio of a time change amount of the active power and the reactive power, a power factor of the distributed generator interconnected to a demand side of the electric power system from a measurement point by the measurement means;
distributed-generator power-generation-amount estimation means for having, from active power and reactive power at a time of no power when the distributed generator interconnected to the electric power system is not generating power, a first characteristic line representing a load characteristic on a coordinate plane based on active power and reactive power, determining, from the measured active power, the measured reactive power, and the power factor of the distributed generator, a second characteristic line representing a distributed-generator characteristic on the coordinate plane, and estimating the difference between the active power and the reactive power at an intersection point of the first characteristic line and the second characteristic line, and the measured active power and the measured reactive power as the power generation amount of the distributed generator; and
output means for outputting power-generation-amount estimation information on the distributed generator estimated by the distributed-generator power-generation-amount estimation means.

2. The distributed-generator power-generation-amount estimation apparatus according to claim 1, further comprising:
an input function configured to input a setting condition used in internal processing, wherein
the input function sets a power-generation-amount estimation cycle and a tidal-current-measurement-value interval for estimating a power factor.

3. The distributed-generator power-generation-amount estimation apparatus according to claim 2, further comprising:
power-factor-abnormal-value determination means for determining and excluding an abnormal value of the power factor calculated by the power-factor estimation means, wherein
the input function sets and inputs a value of a power-factor normal range for abnormal-value determination by the power-factor-abnormal-value determination means.

4. The distributed-generator power-generation-amount estimation apparatus according to claim 3, wherein
the input function sets and inputs a reference period of actual data of a power-factor estimation value of the distributed generator and a power-generation-amount estimation value of the distributed generator.

5. The distributed-generator power-generation-amount estimation apparatus according to claim 2, wherein
the input function sets and inputs a reference period of actual data of a power-factor estimation value of the distributed generator and a power-generation-amount estimation value of the distributed generator.

6. The distributed-generator power-generation-amount estimation apparatus according to claim 1, wherein
the output means outputs a visualized image of a process of generating the power-generation-amount estimation information by the distributed-generator power-generation-amount estimation means.

7. The distributed-generator power-generation-amount estimation apparatus according to claim 1, further comprising a storage function, wherein
the storage function includes: a tidal-current-measurement-value database containing the active power and the reactive power measured at the regular intervals by the measurement means installed on the electric power system; a power-factor-control-information database containing power-factor control information which is information on a power-factor instruction amount when a control system of the electric power system performs control to change the power factor of the distributed generator in order to stably supply electric power; and a load-characteristic database containing the first characteristic line representing the load characteristic on the coordinate plane based on the active power and the reactive power.

8. A distributed-generator power-generation-amount estimation method for estimating, from active power and reactive power measured at regular intervals by measurement means installed on an electric power system, a power generation amount of a distributed generator interconnected to the electric power system, the distributed-generator power-generation-amount estimation method comprising:

estimating, as a ratio of a time change amount of the active power and the reactive power, a power factor of the distributed generator interconnected to a demand side of the electric power system from a measurement point by the measurement means; and obtaining, from active power and reactive power at a time of no power when the distributed generator interconnected to the electric power system is not generating power, a first characteristic line representing a load characteristic on a coordinate plane based on active power and reactive power, obtaining, from the measured active power, the measured reactive power, and the power factor of the distributed generator, a second characteristic line representing a distributed-generator characteristic on the coordinate plane, and estimating the difference between the active power and the reactive power at an intersection point of the first characteristic line and the second characteristic line, and the measured active power and the measured reactive power as the power generation amount of the distributed generator.

9. The distributed-generator power-generation-amount estimation method according to claim 8, wherein when a power factor of the distributed generator interconnected to a demand side of the electric power system from the measurement point by the measurement means is estimated as the ratio of the time change amount of the active power and the reactive power, the time change amount is set as a change amount of the active power and the reactive power for a time range from several seconds to several tens of seconds.

10. The distributed-generator power-generation-amount estimation method according to claim 9, further comprising:

putting, in order to obtain the first characteristic line representing the load characteristic on the coordinate plane based on the active power and the reactive power, plots on the coordinate plane according to active power and reactive power measured in the past, and performing linear approximation processing to a point where magnitude of the active power or the reactive power is maximum in a fourth quadrant or a first quadrant on the coordinate plane to obtain a load characteristic of the electric power system.

11. The distributed-generator power-generation-amount estimation method according to claim 8, further comprising:

putting, in order to obtain the first characteristic line representing the load characteristic on the coordinate plane based on the active power and the reactive power, plots on the coordinate plane according to active power and reactive power measured in the past, and performing linear approximation processing to a point where magnitude of the active power or the reactive power is maximum in a fourth quadrant or a first quadrant on the coordinate plane to obtain a load characteristic of the electric power system.

* * * * *